United States Patent
Kosugi et al.

(10) Patent No.: US 11,398,572 B2
(45) Date of Patent: Jul. 26, 2022

(54) SEMICONDUCTOR WAFER MANUFACTURING METHOD, METHOD OF MANUFACTURING SEMICONDUCTOR ENERGY BEAM DETECTING ELEMENT, AND SEMICONDUCTOR WAFER

(71) Applicant: HAMAMATSU PHOTONICS K.K., Hamamatsu (JP)

(72) Inventors: Kazumasa Kosugi, Hamamatsu (JP); Shintaro Kamada, Hamamatsu (JP); Kazuhisa Yamamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/643,961

(22) PCT Filed: Sep. 5, 2018

(86) PCT No.: PCT/JP2018/032912
§ 371 (c)(1),
(2) Date: Mar. 3, 2020

(87) PCT Pub. No.: WO2019/049900
PCT Pub. Date: Mar. 14, 2019

(65) Prior Publication Data
US 2020/0411702 A1    Dec. 31, 2020

(30) Foreign Application Priority Data
Sep. 8, 2017  (JP) .............................. JP2017-173049

(51) Int. Cl.
*H01L 31/18*  (2006.01)
*H01L 31/0236*  (2006.01)
*H01L 31/115*  (2006.01)

(52) U.S. Cl.
CPC ...... *H01L 31/02363* (2013.01); *H01L 31/115* (2013.01); *H01L 31/1876* (2013.01)

(58) Field of Classification Search
None
See application file for complete search history.

(56) References Cited

U.S. PATENT DOCUMENTS 5,552,616 A * 9/1996 Kobayashi ............ H01L 31/105
257/466
6,333,457 B1 * 12/2001 Mulligan ............ H01L 31/1868
136/261
(Continued)

FOREIGN PATENT DOCUMENTS

JP    H9-260709 A    10/1997
JP    2005-533587 A    11/2005
(Continued)

OTHER PUBLICATIONS

International Preliminary Report on Patentability dated Mar. 19, 2020 for PCT/JP2018/032912.

*Primary Examiner* — Benjamin P Sandvik
(74) *Attorney, Agent, or Firm* — Faegre Drinker Biddle & Reath LLP (57) ABSTRACT

A through-slit is provided in a semiconductor wafer. A first virtual cutting line defines a chip portion including an energy ray sensitive region as viewed from a direction perpendicular to a first main surface. The shortest distance from a second virtual cutting line to the edge of a second semiconductor region is smaller than the shortest distance from the first virtual cutting line to the edge of the second semiconductor region. The through-slit penetrates through the semiconductor wafer in the thickness direction along the second virtual cutting line. A side surface to which a first semiconductor region is exposed is formed in the chip portion by providing the through-slit. A fourth semiconductor region of (Continued)

a first conductivity type is provided on the side surface side of the chip portion by adding impurities to the side surface to which the first semiconductor region is exposed.

6 Claims, 7 Drawing Sheets

(56) References Cited

U.S. PATENT DOCUMENTS

| | | | |
|---|---|---|---|
| 2012/0235262 A1 | 9/2012 | Jones et al. | |
| 2014/0061840 A1* | 3/2014 | Oguri | H01L 31/103 257/437 |
| 2017/0373042 A1* | 12/2017 | Shizukuishi | H01L 27/14 |
| 2018/0190839 A1* | 7/2018 | Yoshikawa | H01L 31/0216 |

FOREIGN PATENT DOCUMENTS

| | | |
|---|---|---|
| JP | 2009-177039 A | 8/2009 |
| JP | 2010-239005 A | 10/2010 |
| JP | 2014-220403 A | 11/2014 |
| JP | 2015-019540 A | 1/2015 |
| JP | 2015-50223 A | 3/2015 |
| JP | 2017-034288 A | 2/2017 |
| WO | WO-2004/012274 A1 | 2/2004 |
| WO | WO-2015/019540 A1 | 2/2015 |
| WO | WO-2016/114377 A1 | 7/2016 |

\* cited by examiner

SEMICONDUCTOR WAFER MANUFACTURING METHOD, METHOD OF MANUFACTURING SEMICONDUCTOR ENERGY BEAM DETECTING ELEMENT, AND SEMICONDUCTOR WAFER

TECHNICAL FIELD

The present invention relates to a semiconductor wafer manufacturing method, a method of manufacturing a semiconductor energy ray detecting element, and a semiconductor wafer.

BACKGROUND ART

Patent Literature 1 discloses a semiconductor wafer manufacturing method. In this manufacturing method, a plurality of holes are formed in the semiconductor wafer along virtual cutting lines for separating elements from the semiconductor wafer. Impurities are added to the semiconductor wafer through the plurality of holes. As a result, a region where impurities are added is formed around each hole.

CITATION LIST

Patent Literature

Patent Literature 1: Japanese Unexamined Patent Publication No. 2015-19540

SUMMARY OF INVENTION

Technical Problem

A known semiconductor energy ray detecting element includes a semiconductor substrate having a first main surface and a second main surface facing each other. In this semiconductor energy ray detecting element, the semiconductor substrate has a first semiconductor region of a first conductivity type, being located on the first main surface side, a second semiconductor region of a second conductivity type, being located on the first main surface side and forming an energy ray sensitive region together with the first semiconductor region, and a third semiconductor region of the first conductivity type, being located on the second main surface side and having a higher impurity concentration than the first semiconductor region.

In order to operate the semiconductor energy ray detecting element described above, a bias voltage is applied to the semiconductor energy ray detecting element. The bias voltage is about several tens to one thousand volts, for example. In this case, the first semiconductor region needs to be in a fully depleted state in which a depletion layer spreading from the second semiconductor region reaches an interface with the third semiconductor region from the first main surface side. When the semiconductor substrate (first semiconductor region) is fully depleted, if the depletion layer reaches the side surface of the semiconductor substrate (first semiconductor layer), the leakage current from the side surface may increase. For this reason, it is conceivable that the distance between the side surface and the second semiconductor region is set to a relatively large value so that the depletion layer does not reach the side surface even in a case where the first semiconductor layer is fully depleted.

A region between the side surface and the second semiconductor region in the semiconductor substrate is a region that is unlikely to contribute to detection of energy rays. Hereinafter, the region that is unlikely to contribute to detection of energy rays is referred to as a "dead area". If the dead area can be reduced, it is possible to expand a region that contributes to detection of energy rays. Hereinafter, a region that contributes to detection of energy rays is referred to as an "effective area". However, if the dead area is reduced, there is a concern about an increase in leakage current from the side surface due to the depletion layer described above. Therefore, in order to suppress the depletion layer from reaching the side surface of the semiconductor substrate in a state where the semiconductor substrate (first semiconductor layer) is fully depleted, it is conceivable that a fourth semiconductor region of the first conductivity type, having a higher impurity concentration than the first semiconductor region and provided on the side surface side of the semiconductor substrate.

In a case where the method disclosed in Patent Literature 1 is applied to form the fourth semiconductor region, the following problems may occur. In a case where the diameter of the hole is small, it is difficult for impurities to be added to the semiconductor wafer, and accordingly there is a possibility that a region where no impurities are added will be present along a virtual cutting line. In a case where a region where no impurities are added is present, the depletion layer may reach the side surface through the region. In a case where the diameter of the hole is large, impurities are easily added to the semiconductor wafer, but the thickness of the region where impurities are added, that is, the thickness of the fourth semiconductor region may need to be increased. Since the fourth semiconductor region is a dead area, the effective area is reduced if the thickness of the fourth semiconductor region is increased.

A first aspect of the present invention is to provide a semiconductor wafer manufacturing method used for manufacturing a semiconductor energy ray detecting element capable of suppressing an increase in leakage current from the side surface while a dead area is reduced. A second aspect of the present invention is to provide a method of manufacturing a semiconductor energy ray detecting element using a semiconductor wafer used for manufacturing a semiconductor energy ray detecting element capable of suppressing an increase in leakage current from the side surface while a dead area is reduced. A third aspect of the present invention is to provide a semiconductor wafer used for manufacturing a semiconductor energy ray detecting element capable of suppressing an increase in leakage current from the side surface while a dead area is reduced.

Solution to Problem

The first aspect of the present invention is a semiconductor wafer manufacturing method. In the first aspect, a semiconductor wafer having a first semiconductor region of a first conductivity type including a first main surface and a second main surface facing each other is prepared. A second semiconductor region of a second conductivity type, forming an energy ray sensitive region together with the first semiconductor region, is provided on the first main surface side of the first semiconductor region. A third semiconductor region of the first conductivity type, having a higher impurity concentration than the first semiconductor region, is provided on the second main surface side of the first semiconductor region. A through-slit penetrating through the semiconductor wafer in a thickness direction of the semiconductor wafer along a second virtual cutting line of a first virtual cutting line and the second virtual cutting line, as viewed from a direction perpendicular to the first main surface, is provided. The first virtual cutting line defines a chip portion including the energy ray sensitive region. A shortest distance from the second virtual cutting line to an edge of the second semiconductor region is smaller than a shortest distance from the first virtual cutting line to the edge of the second semiconductor region. A side surface to which the first semiconductor region is exposed is formed in the chip portion by providing the through-slit. A fourth semiconductor region of a first conductivity type is provided on the side surface side by adding impurities to the side surface.

In the first aspect, as viewed from the direction perpendicular to the first main surface, the shortest distance from the second virtual cutting line to the edge of the second semiconductor region is set to be smaller than the shortest distance from the first virtual cutting line to the edge of the second semiconductor region. In this manufacturing method, the side surface to which the first semiconductor region is exposed is formed in the semiconductor wafer by providing the through-slit along the second virtual cutting line, and the fourth semiconductor region of the first conductivity type is provided on the side surface. Therefore, the semiconductor wafer manufactured by this manufacturing method has a chip portion in which the dead area is reduced and an increase in leakage current from the side surface can be suppressed by the fourth semiconductor region. Since impurities are added to the side surface that is exposed by providing the through-slit, the impurities are added more appropriately than in a case where the impurities are added from holes.

In the first aspect, the through-slit may be provided by dry etching. In this case, the inclination of the side surface can be reduced compared with a case where the through-slit is provided by wet etching. Therefore, the dead area can be reduced compared with a case where the side surface is made to be inclined by using wet etching.

In the first aspect, a metal layer may be provided on the first main surface and the second main surface. The impurities may be added to the side surface of the chip portion by ion implantation after the metal layer is provided. In this case, since the impurities are added by ion implantation, heat applied to the semiconductor wafer can be reduced compared with a case where the impurities are added by diffusion. Therefore, it is possible to manufacture the semiconductor wafer in which the metal layer can be appropriately formed and the impurities are sufficiently added.

In the first aspect, the third semiconductor region may be provided such that a length of the third semiconductor region in a thickness direction of the third semiconductor region is smaller than a length of the second semiconductor region in a thickness direction of the second semiconductor region. In this case, for example, energy rays having low light transmittance, such as soft X-rays, are unlikely to be absorbed in the third semiconductor region, so that the detection accuracy is improved. In this manufacturing method, impurities are added to the side surface that is exposed by providing the through-slit. For this reason, also in this case, the third semiconductor region and the fourth semiconductor region are easily and appropriately connected to each other, and accordingly an increase in leakage current can be suppressed.

The second aspect of the present invention is a method of manufacturing a semiconductor energy ray detecting element. In the second aspect, a semiconductor wafer manufactured by the manufacturing method described above is prepared. The chip portion is cut off along the first virtual cutting line.

In the second aspect, as viewed from the direction perpendicular to the first main surface, the shortest distance from the second virtual cutting line to the edge of the second semiconductor region is set to be smaller than the shortest distance from the first virtual cutting line to the edge of the second semiconductor region. A side surface to which the first semiconductor region is exposed is formed in the semiconductor wafer by providing the through-slit along the second virtual cutting line. A fourth semiconductor region of the first conductivity type is provided on the side surface. Therefore, in the semiconductor energy ray detecting element manufactured by this manufacturing method, the dead area is reduced, and an increase in leakage current from the side surface can be suppressed by the fourth semiconductor region. Since impurities are added to the side surface that is exposed by providing the through-slit, the impurities can be added more appropriately than in a case where the impurities are added from holes. The shortest distance from the second virtual cutting line to the edge of the second semiconductor region is set to be smaller than the shortest distance from the first virtual cutting line to the edge of the second semiconductor region. That is, the shortest distance from the first virtual cutting line to the edge of the second semiconductor region is set to be larger than the shortest distance from the second virtual cutting line to the edge of the second semiconductor region. Therefore, it is suppressed that the depletion layer reaches a cut surface along the first virtual cutting line.

The third aspect of the present invention is a semiconductor wafer. The semiconductor wafer has a first main surface and a second main surface that facing each other. The semiconductor wafer includes a chip portion. The chip portion includes an energy ray sensitive region and is defined by a through-slit penetrating in a thickness direction and a virtual cutting line as viewed from a direction perpendicular to the first main surface. The chip portion has a first semiconductor region of a first conductivity type, a second semiconductor region of a second conductivity type, a third semiconductor region of the first conductivity type, and a fourth semiconductor region of the first conductivity type. The first semiconductor region is located on the first main surface side. The second semiconductor region is located on the first main surface side, and forms the energy ray sensitive region together with the first semiconductor region. The third semiconductor region is located on the second main surface side, and has a higher impurity concentration than the first semiconductor region. The fourth semiconductor region is located on a side surface side connected to the first main surface and the second main surface, and has a higher impurity concentration than the first semiconductor region. The shortest distance from the side surface of the chip portion to the edge of the second semiconductor region is smaller than the shortest distance from the virtual cutting line to the edge of the second semiconductor region.

In the third aspect, the chip portion has the fourth semiconductor region located on the side surface. The shortest distance from the side surface of the chip portion to the edge of the second semiconductor region is smaller than the shortest distance from the virtual cutting line to the edge of the second semiconductor region. Therefore, cutting the chip portion with the virtual cutting line makes it possible to manufacture the semiconductor energy ray detecting element in which the dead area is reduced and in which an increase in leakage current from the side surface in the fourth semiconductor region can be suppressed.

Advantageous Effects of Invention

According to the first aspect of the present invention, there is provided a semiconductor wafer manufacturing method used for manufacturing a semiconductor energy ray detecting element capable of suppressing an increase in leakage current from the side surface while a dead area is reduced. According to the second aspect of the present invention, there is provided a method of manufacturing a semiconductor energy ray detecting element using a semiconductor wafer used for manufacturing a semiconductor energy ray detecting element capable of suppressing an increase in leakage current from the side surface while a dead area is reduced. According to the third aspect of the present invention, there is provided a semiconductor wafer used for manufacturing a semiconductor energy ray detecting element capable of suppressing an increase in leakage current from the side surface while a dead area is reduced.

DESCRIPTION OF EMBODIMENTS

Hereinafter, an embodiment of the present invention will be described in detail with reference to the accompanying diagrams. In addition, in the description, the same reference numerals are used for the same elements or elements having the same functions, and the repeated description thereof will be omitted.

Figure 1:
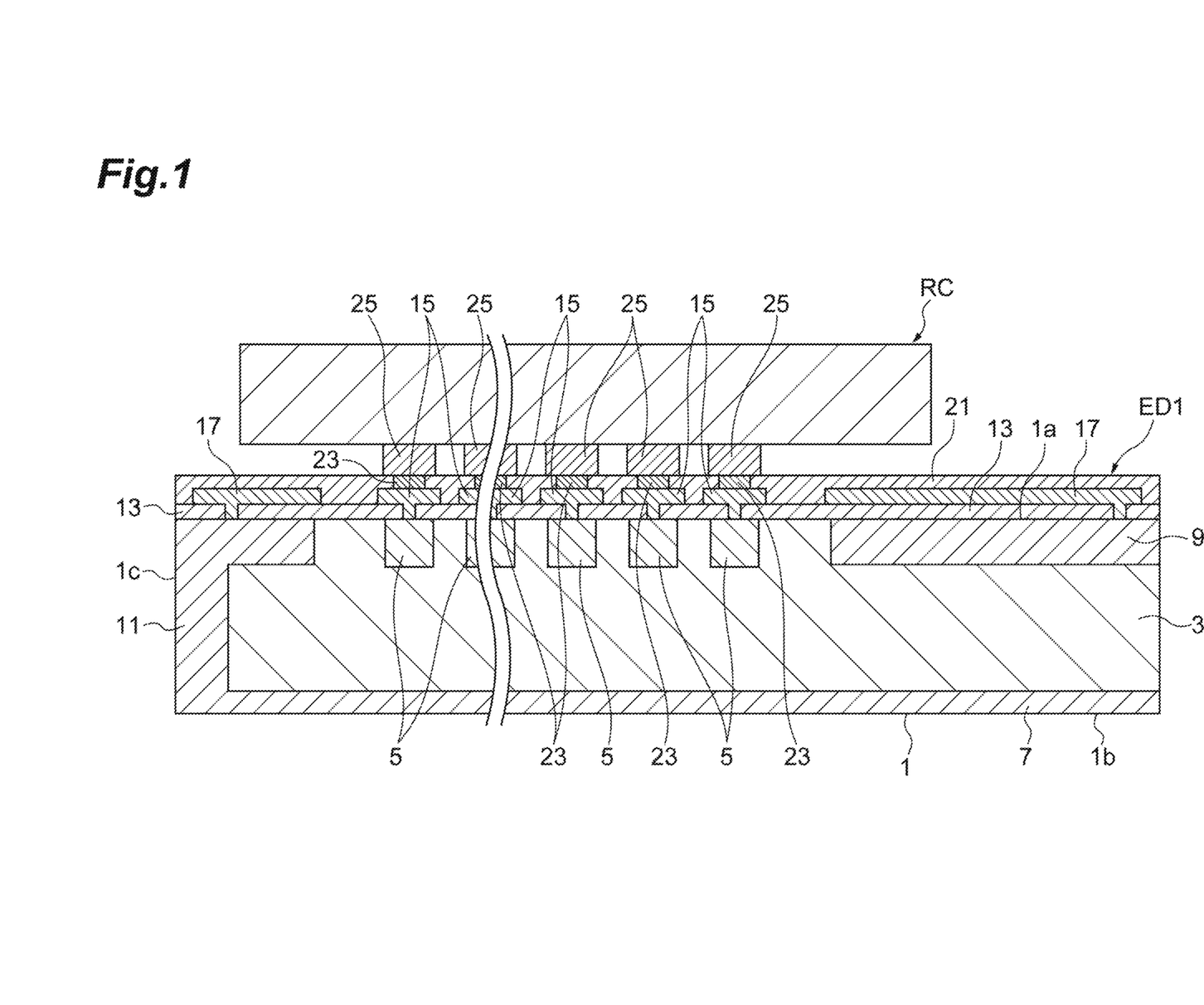
FIG. 1 is a diagram for describing the cross-sectional configuration of a semiconductor energy ray detecting element according to an embodiment.
Figure 2:
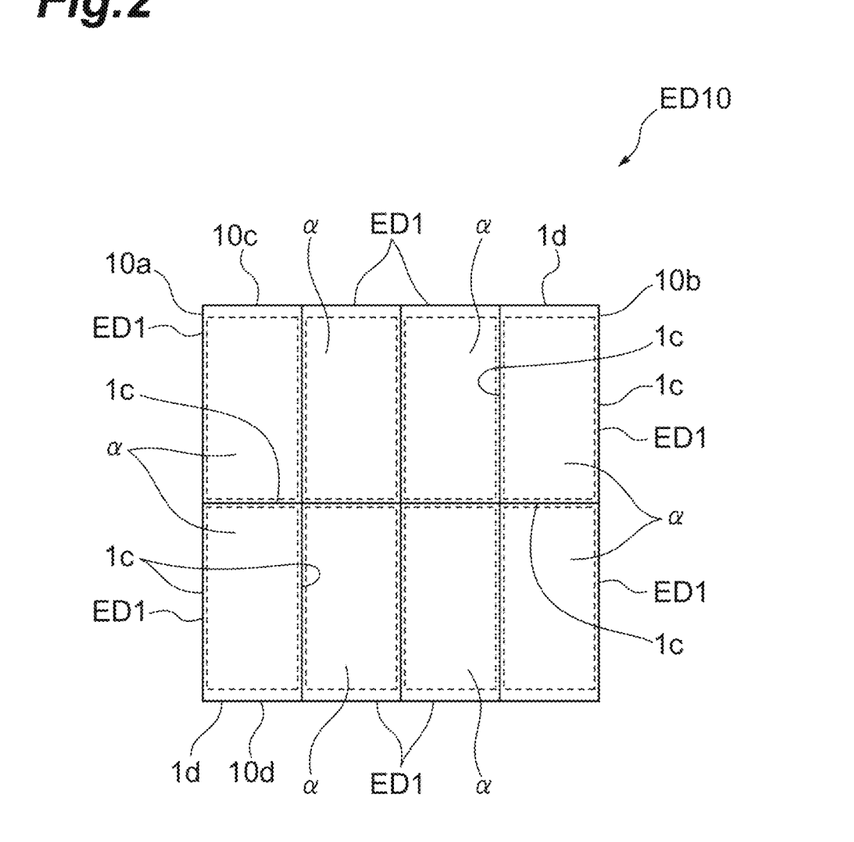
FIG. 2 is a schematic plan view illustrating an arrangement example of semiconductor energy ray detecting elements.

With reference to FIGS. 1 and 2, the configuration of a semiconductor energy ray detecting element ED1 according to the present embodiment will be described. FIG. 1 is a diagram for describing the cross-sectional configuration of the semiconductor energy ray detecting element according to the present embodiment. FIG. 2 is a schematic plan view illustrating an arrangement example of semiconductor energy my detecting elements.

The semiconductor energy ray detecting element ED1 includes a semiconductor substrate 1 as illustrated in FIG. 1. The semiconductor substrate 1 is a first conductivity type silicon substrate having a pair of main surfaces $1a$ and $1b$ facing each other, a plurality of side surfaces $1c$, and a side surface $1d$. The first conductivity type is, for example, n-type. The plurality of side surfaces $1c$ and a side surface $1d$ extend in a direction in which the pair of main surfaces $1a$ and $1b$ face each other so as to connect the pair of main surfaces $1a$ and $1b$. The direction in which the pair of main surfaces $1a$ and $1b$ face each other is a thickness direction.

As illustrated in FIG. 2, the semiconductor substrate 1 has a rectangular shape in plan view. In the present embodiment, a plurality of semiconductor energy ray detecting elements ED1 form a semiconductor energy ray detecting element group ED10. The semiconductor energy ray detecting element group ED10 includes a plurality of semiconductor energy ray detecting elements ED1. The plurality of semiconductor energy ray detecting elements ED1 are arranged in a two-dimensional matrix as viewed from the thickness direction. Specifically, eight semiconductor energy ray detecting elements ED1 are arranged in two rows and four columns with the side surfaces $1c$ adjacent to each other. Side surfaces $10a$ and $10b$ facing each other of the outer frame of the semiconductor energy ray detecting element group ED10 are formed by the side surfaces $1c$, and side surfaces $10c$ and $10d$ facing each other of the outer frame of the semiconductor energy ray detecting element group ED10 are formed by the side surfaces $1d$.

As illustrated in FIG. 1, the semiconductor energy ray detecting element ED1 has an insulating film 13 and electrodes 15 and 17 provided on the semiconductor substrate 1. The insulating film 13 is provided on the main surface $1a$ side of the semiconductor substrate 1 so as to cover the main surface $1a$ of the semiconductor substrate 1. The insulating film 13 is formed of, for example, $SiO_2$. The electrodes 15 and 17 are provided on the insulating film 13. The electrodes 15 and 17 are formed of, for example, an electrode material such as aluminum. Although not illustrated, an electrode is also formed on the main surface $1b$ side of the semiconductor substrate 1.

The semiconductor energy ray detecting element ED1 further has a passivation film 21 and a bump electrode 23. The passivation film 21 is disposed on the main surface $1a$ side of the semiconductor substrate 1 so as to cover the main surface $1a$ of the semiconductor substrate 1, the insulating film 13, and the electrodes 15 and 17. The passivation film 21 is formed of, for example, SiN. The bump electrode 23 is disposed on the electrode 15, and is electrically connected to the corresponding electrode 15 from a portion where the passivation film 21 is partially removed. The bump electrode 23 is formed of, for example, Sn—Ag.

The semiconductor energy ray detecting element ED1 is mounted on an ROIC chip RC as illustrated in FIG. 1. Specifically, the semiconductor energy ray detecting element ED1 is bump-connected to the ROIC chip RC. The ROIC chip RC includes a plurality of pad electrodes 25, and the pad electrode 25 and the bump electrode 23 corresponding to each other are connected. The semiconductor energy ray detecting element ED1 and the ROIC chip RC are disposed close to each other. The main surface $1a$ of the semiconductor substrate 1 faces the ROIC chip RC.

In the semiconductor energy ray detecting element ED1, in the embodiment described above, the main surface $1a$ of the semiconductor substrate 1 may be a surface where energy rays are incident on the semiconductor substrate 1 (incidence surface), or the main surface $1b$ of the semiconductor substrate 1 may be the incidence surface. In the present embodiment, the main surface $1b$ of the semiconductor substrate 1 is an incidence surface.

In the semiconductor energy ray detecting element ED1, when a bias voltage is applied to the semiconductor substrate 1, a depletion layer spreads in the semiconductor substrate 1 to cause a fully depleted state. The voltage applied to the semiconductor substrate 1 is, for example, a reverse bias voltage. Causing the fully depleted state may allow a signal corresponding to the energy ray to be appropriately output from the semiconductor energy ray detecting element ED1 to the ROIC chip RC.

Figure 3:
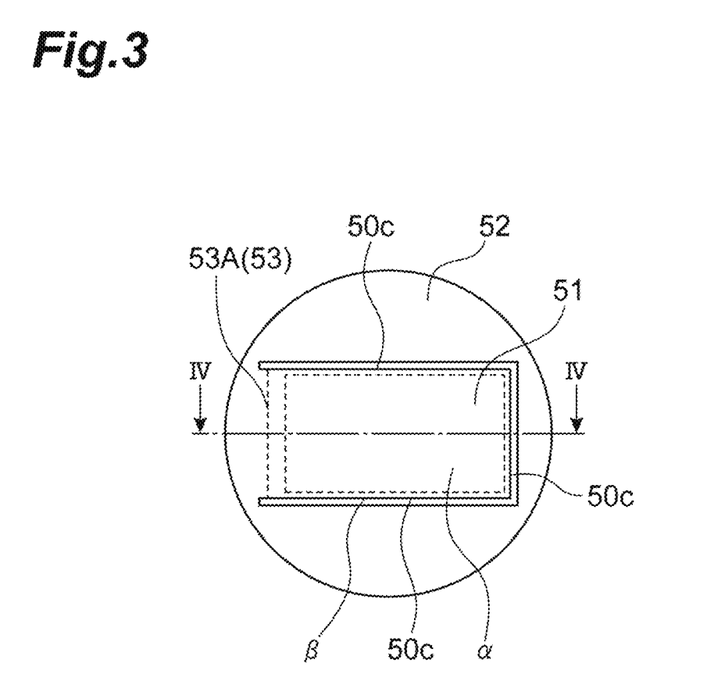
FIG. 3 is a schematic plan view of a semiconductor wafer.
Figure 4:
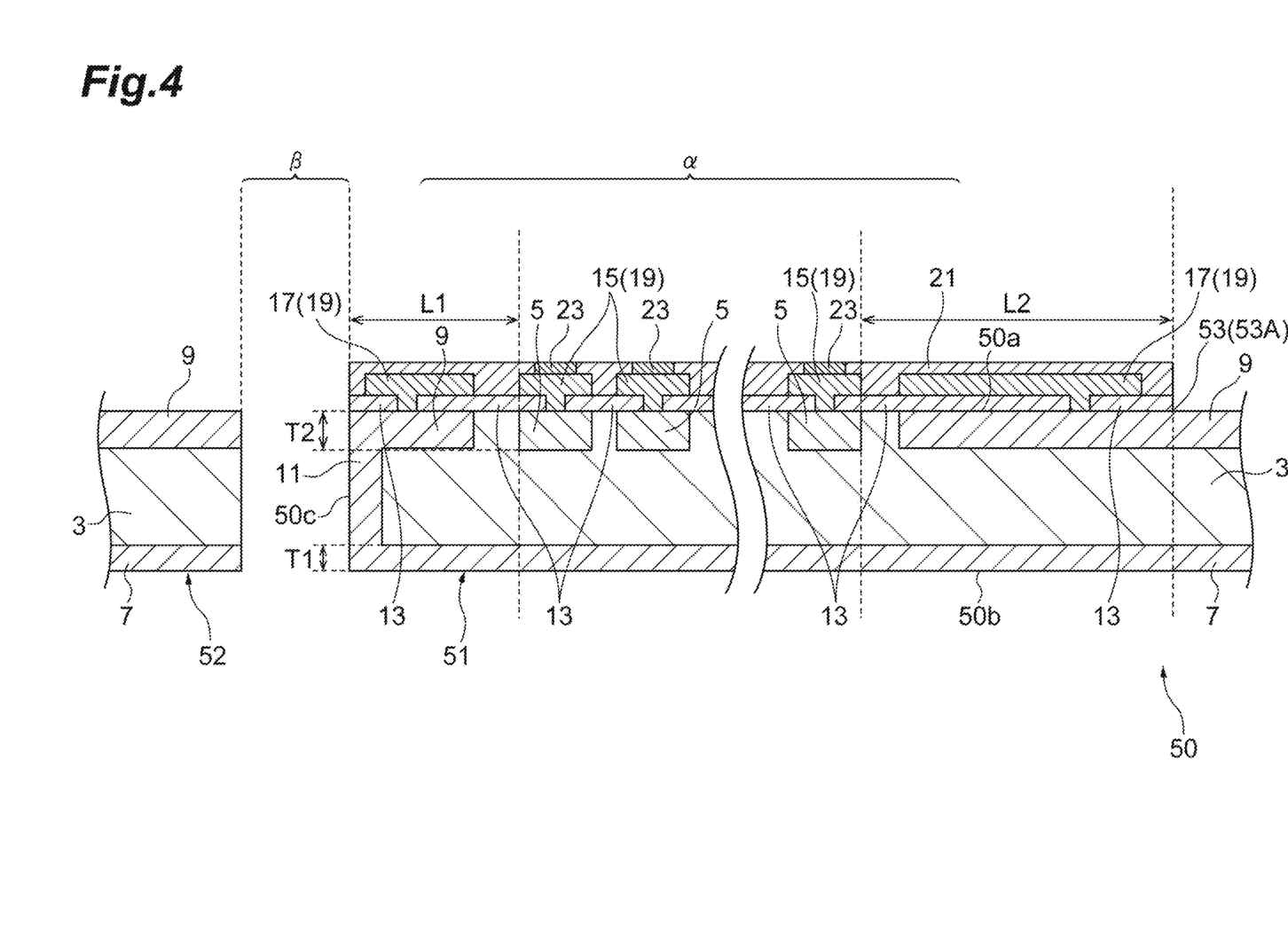
FIG. 4 is a diagram illustrating the cross-sectional configuration of a semiconductor wafer.

Next, the configuration of a semiconductor wafer 50 used for manufacturing of the semiconductor substrate 1 of the semiconductor energy ray detecting element ED1 will be described with reference to FIGS. 3 and 4. FIG. 3 is a schematic plan view of the semiconductor wafer 50. FIG. 4 is a schematic cross-sectional view taken along the line IV-IV of the semiconductor wafer 50 illustrated in FIG. 3.

The semiconductor wafer 50 has a circular shape in plan view, and has a pair of main surfaces 50a and 50b facing each other. As illustrated in FIG. 3, the semiconductor wafer 50 includes a chip portion 51 including an energy ray sensitive region a and a blank portion 52 excluding the chip portion 51. The chip portion 51 has a rectangular shape in plan view, and is disposed near the center of the semiconductor wafer 50. The blank portion 52 is disposed so as to surround the chip portion 51.

The chip portion 51 is defined by a through-slit β penetrating in the thickness direction and a virtual cutting line 53 as viewed from a direction (thickness direction) perpendicular to the main surface 50a. The chip portion 51 and the blank portion 52 are connected by the virtual cutting line 53. In the present embodiment, the through-slit β is provided along three sides of the four sides of the edge of the chip portion 51, and the virtual cutting line 53 is set along the remaining one side. The semiconductor substrate 1 is formed by cutting the semiconductor wafer 50 along the virtual cutting line 53 to cut off the chip portion 51. As illustrated in FIG. 4, the chip portion 51 has a side surface 50c connected to the main surface 50a and the main surface 50b along the through-slit β.

The chip portion 51 has a semiconductor region 3 of a first conductivity type, being located on the main surface 50a side and a plurality of semiconductor regions 5 of a second conductivity type, being located on the main surface 50a side. The first conductivity type is, for example, n-type, and the second conductivity type is, for example, p-type. The semiconductor region 3 is a region where first conductivity type impurities are added. The first conductivity type impurities added to the semiconductor region 3 are, for example, antimony, arsenic, or phosphorus. The semiconductor region 3 is also provided in the blank portion 52. The semiconductor region 3 in the chip portion 51 is connected to the semiconductor region 3 in the blank portion 52 through the virtual cutting line 53. The plurality of semiconductor regions 5 are arranged in a two-dimensional matrix as viewed from the thickness direction.

A part of the semiconductor region 3 is interposed between the semiconductor regions 5. The semiconductor regions 5 are separated from each other. Each semiconductor region 5 is a region where second conductivity type impurities are added, and has a higher impurity concentration than the semiconductor region 3. The second conductivity type impurities are, for example, boron. The semiconductor region 3 and each semiconductor region 5 form the energy ray sensitive region a by p-n junctions.

The chip portion 51 further has a semiconductor region 7 of the first conductivity type, being located on the main surface 50b side. The semiconductor region 7 has a higher impurity concentration than the semiconductor region 3. The semiconductor region 7 is a region where the first conductivity type impurities are added, and has a higher impurity concentration than the semiconductor region 3. The first conductivity type impurities added to the semiconductor region 7 are, for example, antimony, arsenic, or phosphorus.

The semiconductor region 7 is also provided on the main surface 50b side of the blank portion 52. The semiconductor region 7 at the outer edge of the chip portion 51 is connected to the semiconductor region 7 of the blank portion 52 through the virtual cutting line 53. The length T1 of the semiconductor region 7 in the thickness direction of the semiconductor region 7 is smaller than the length T2 of the semiconductor region 5 in the thickness direction of the semiconductor region 5.

The chip portion 51 has a semiconductor region 9 of the first conductivity type on the main surface 50a side. The semiconductor region 9 is also a region where the first conductivity type impurities are added, and has a higher impurity concentration than the semiconductor region 3. The first conductivity type impurities added to the semiconductor region 9 are, for example, antimony, arsenic, or phosphorus. The semiconductor region 9 is also provided on the main surface 50a side of the blank portion 52. The semiconductor region 9 at the outer edge of the chip portion 51 is connected to the semiconductor region 9 of the blank portion 52 through the virtual cutting line 53.

The semiconductor region 9 of the chip portion 51 is located so as to surround the periphery of a region, in which the plurality of semiconductor regions 5 are located, along the outer edge of the chip portion 51 on the main surface 50a side as viewed from the thickness direction. The semiconductor region 9 of the chip portion 51 functions as a guard ring. In the chip portion 51, a part of the semiconductor region 3 is interposed between the semiconductor region 5 and the semiconductor region 9. The semiconductor region 5 and the semiconductor region 9 are separated from each other.

As illustrated in FIG. 4, a shortest distance L1 is smaller than a shortest distance L2. The shortest distance L1 is the shortest distance from the side surface 50c to the edge of the semiconductor region 5 closest to the side surface 50c. The shortest distance L2 is the shortest distance from the virtual cutting line 53 to the edge of the semiconductor region 5 closest to the virtual cutting line 53. The shortest distance from the side surface 50c to the edge of the semiconductor region 5 is smaller than the shortest distance from the virtual cutting line 53 to the edge of the semiconductor region 5. As described above, the semiconductor region 5 forms the energy ray sensitive region a. Therefore, the shortest distance from the side surface 50c to the energy ray sensitive region a is smaller than the shortest distance from the virtual cutting line 53 to the energy ray sensitive region a.

The chip portion 51 has the insulating film 13 that covers the main surface 50a, and has the electrodes 15 and 17 on the semiconductor region 5, the semiconductor region 7, and the semiconductor region 9. From a portion where the insulating film 13 is partially removed, the electrode 15 is connected to the semiconductor region 5, and the electrode 17 is connected to the semiconductor region 9. Although not illustrated, an electrode connected to the semiconductor region 7 is also formed on the main surface 50b side. The chip portion 51 further has the passivation film 21 that covers the insulating film 13 and the electrodes 15 and 17, and has the bump electrode 23 electrically connected to the electrode 15 from a portion where the passivation film 21 is partially removed on the electrode 15.

The chip portion 51 has a semiconductor region 11 of the first conductivity type, being located on the side surface 50c side. The semiconductor region 11 has a higher impurity concentration than the semiconductor region 3. The semiconductor region 11 is connected to the semiconductor region 7 and the semiconductor region 9. The semiconductor region 11 is exposed to the side surface 50c, and forms at least a part of the side surface 50c. In the present embodiment, the semiconductor region 7, the semiconductor region 9, and the semiconductor region 11 are exposed to the side surface 50c, and the semiconductor region 7, the semiconductor region 9, and the semiconductor region 11 form the side surface 50c. The side surface 50c is formed by a semiconductor region having a higher impurity concentration than the semiconductor region 3. The semiconductor region 3 is not exposed to the side surface 50c. The semiconductor region 11 may form the entire side surface 50c.

The chip portion 51 of the semiconductor wafer 50 having the above-described configuration functions as the semiconductor energy ray detecting element ED1. When a bias voltage is applied between the semiconductor region 5 and the semiconductor region 7, a depletion layer spreads from the semiconductor region 5 to the semiconductor region 3. The bias voltage applied between the semiconductor region 5 and the semiconductor region 7 is, for example, a reverse bias voltage. A state in which the depletion layer reaches the semiconductor region 7 is a fully depleted state. Causing the fully depleted state may allow a signal corresponding to the energy ray to be output from the semiconductor energy ray detecting element ED1.

Figure 5:
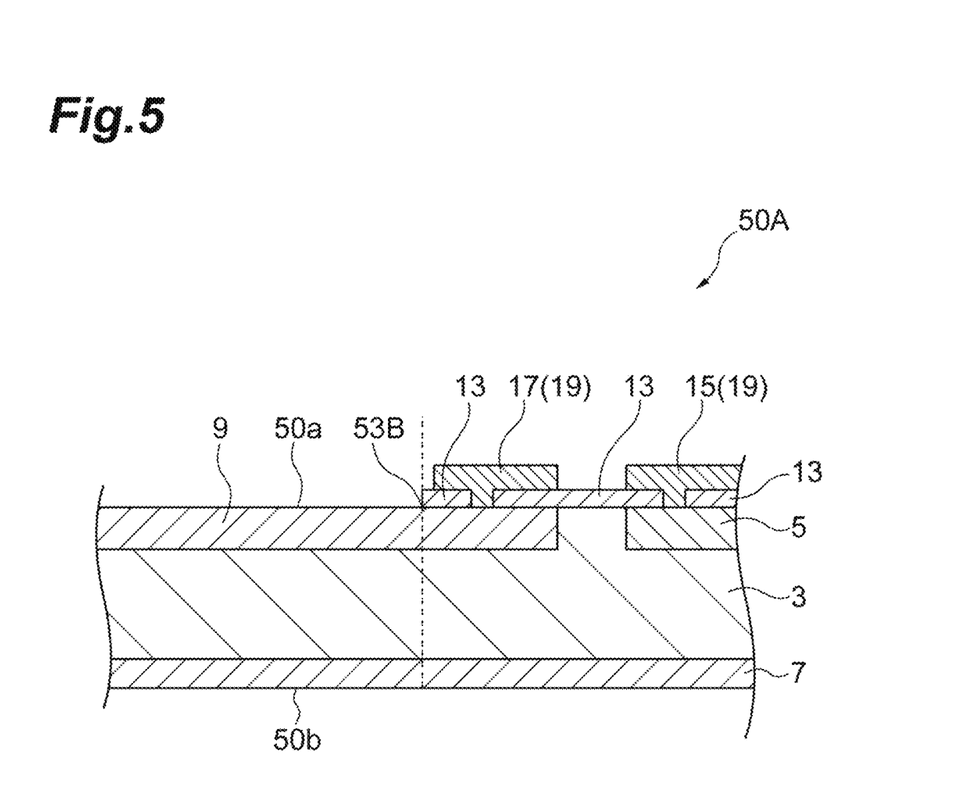
FIG. 5 is a diagram illustrating a semiconductor wafer manufacturing method.
Figure 6:
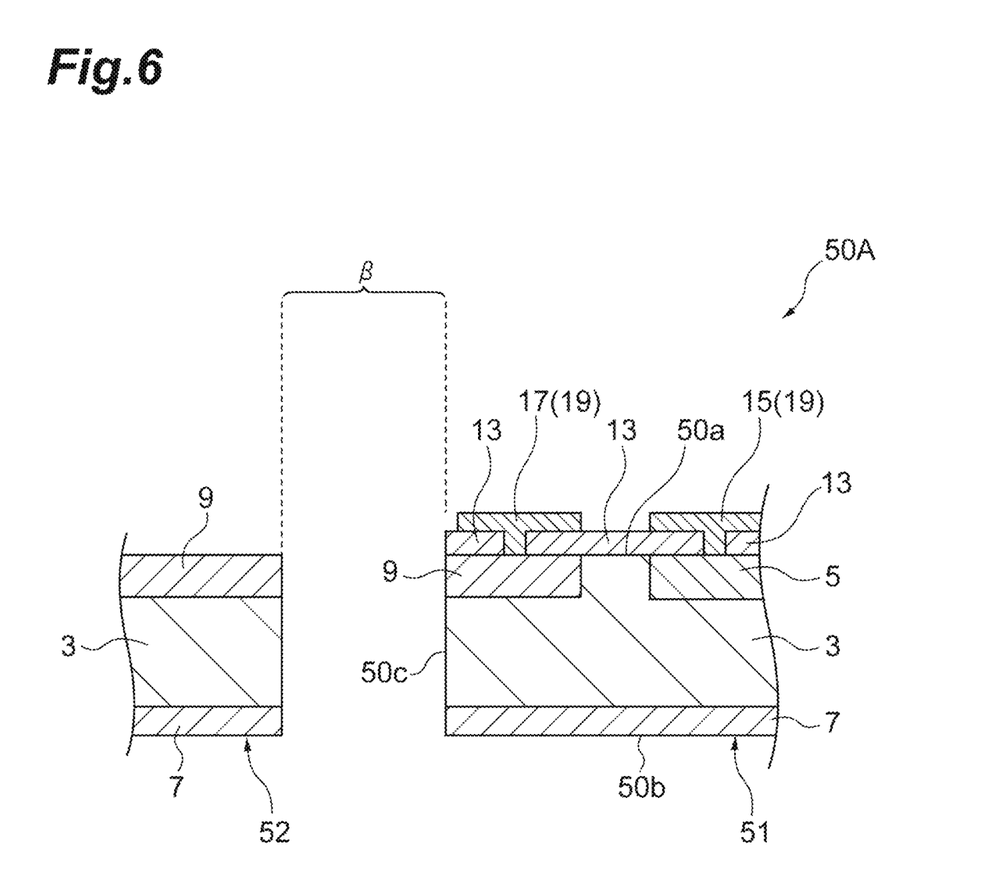
FIG. 6 is a diagram illustrating a semiconductor wafer manufacturing method.
Figure 7:
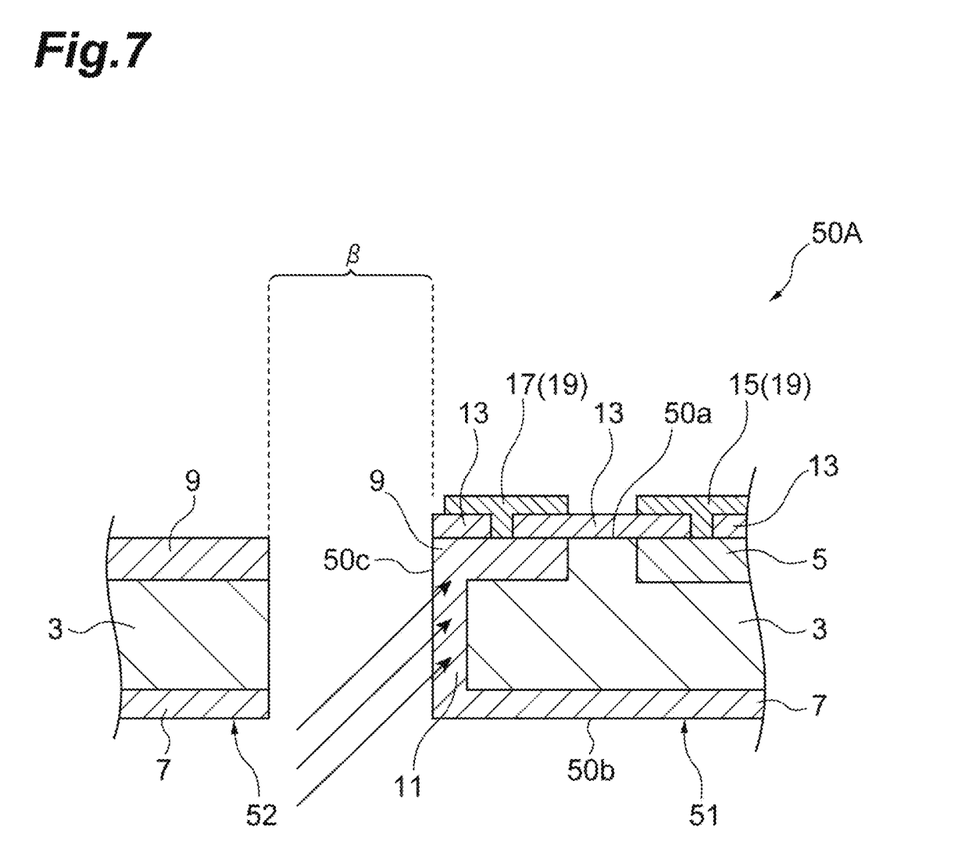
FIG. 7 is a diagram illustrating a semiconductor wafer manufacturing method.

Next, an example of a method of manufacturing the semiconductor wafer 50 will be described with reference to FIGS. 5 to 7. FIGS. 5 to 7 illustrate each configuration in the cross section of the semiconductor wafer 50 illustrated in FIG. 4.

First, a semiconductor wafer 50A having the semiconductor region 3 of the first conductivity type, including a main surface 50a and a main surface 50b facing each other, is prepared. The semiconductor wafer 50A is the semiconductor wafer 50 before processing, and is a first conductivity type silicon substrate.

Then, the semiconductor region 5 of the second conductivity type is provided on the main surface 50a side of the semiconductor region 3. In the present embodiment, the semiconductor region 5 is provided on the main surface 50a side by adding the second conductivity type impurities from the main surface 50a to the semiconductor wafer 50A using an ion implantation method. As a result, the energy ray sensitive region a is formed from the semiconductor region 3 and the semiconductor region 5.

Then, the semiconductor region 7 of the first conductivity type, having a higher impurity concentration than the semiconductor region 3, is provided on the main surface 50b side of the semiconductor region. In the present embodiment, the semiconductor region 7 is provided on the main surface 50b side by adding first conductivity type impurities from the main surface 50b to the semiconductor wafer 50A using an ion implantation method. The semiconductor region 7 is provided such that the length T1 of the semiconductor region 7 in the thickness direction of the semiconductor region 7 is smaller than the length T2 of the semiconductor region 5 in the thickness direction of the semiconductor region 5.

Then, the insulating film 13 is formed on the main surface 50a so as to cover the main surface 50a of the semiconductor wafer 50A. The insulating film 13 is formed by, for example, a thermal oxidation method, a sputtering method, or a Plasma-enhanced Chemical Vapor Deposition (PECVD) method. Then, the electrodes 15 and 17 are formed by removing a part of the insulating film 13 formed on the semiconductor region 5 and the semiconductor region 9 and then providing a metal layer 19 on the semiconductor region 5 and the semiconductor region 9. Although not illustrated, similar to the formation of the insulating film 13 and the electrodes 15 and 17, electrodes connected to the semiconductor region 7 are formed by forming an insulating film on the main surface 50b, removing a part of the insulating film, and then forming a metal layer on the semiconductor region 7.

Here, as illustrated in FIGS. 4 and 5, a virtual cutting line 53A and a virtual cutting line 53B that define the chip portion 51 as viewed from a direction (thickness direction) perpendicular to the main surface 50a are set. The outer edge of the chip portion 51 is defined by the virtual cutting line 53A and the virtual cutting line 53B. The shortest distance L1 from the virtual cutting line 53B to the edge of the semiconductor region 5 closest to the virtual cutting line 53B is smaller than the shortest distance L2 from the virtual cutting line 53A to the edge of the semiconductor region 5 closest to the virtual cutting line 53A. The shortest distance from the virtual cutting line 53B to the edge of the semiconductor region 5 is smaller than the shortest distance from the virtual cutting line 53A to the edge of the semiconductor region 5.

Then, as illustrated in FIG. 6, the side surface 50c to which the semiconductor region 3 is exposed is formed in the chip portion 51 by providing the through-slit penetrating through the semiconductor wafer 50A in the thickness direction along the virtual cutting line 53B. In the present embodiment, the through-slit β is provided by dry etching on the semiconductor wafer 50A.

Then, impurities are added to the side surface 50c to provide the semiconductor region 11 of the first conductivity type of the side surface 50c side. In the present embodiment, as illustrated in FIG. 7, the semiconductor region 11 of the first conductivity type is provided on the side surface 50c side by adding first conductivity type impurities from the side surface 50c to the chip portion 51 through the through-slit β using an ion implantation method. The arrows illustrated in FIG. 7 indicate the direction of impurity implantation. The impurities are implanted from a direction crossing the side surface 50c. The larger the width of the through-slit β, the larger the inclination of the impurity implantation direction with respect to the side surface 50c. The semiconductor region 5, the semiconductor region 7, the semiconductor region 9, and the semiconductor region 11 may be provided by adding impurities using a diffusion method instead of the ion implantation method.

Then, the passivation film 21 is provided on the main surface 50a side of the semiconductor wafer 50A so as to cover the insulating film 13 and the electrodes 15 and 17. The passivation film 21 is formed by, for example, a Chemical Vapor Deposition (CVD) method. Then, after removing a part of the passivation film 21 formed on each electrode 15, the bump electrode 23 is provided. Each bump electrode 23 is electrically connected to the corresponding electrode 15. As a method of forming the bump electrode 23, a method of mounting a solder ball or a printing method can be used.

The semiconductor wafer 50 is manufactured by the above-described manufacturing method. Using the semiconductor wafer 50, the semiconductor energy ray detecting element ED1 can be manufactured. In the present embodiment, the semiconductor wafer 50 is prepared, a plurality of pad electrodes 25 provided in the ROIC chip RC are connected to the corresponding bump electrodes 23, and then the chip portion 51 is cut off along the virtual cutting line 53 (virtual cutting line 53A) of the semiconductor wafer 50. The cut chip portion 51 functions as the semiconductor energy ray detecting element ED1. In the present embodiment, the blank portion 52 and the chip portion 51 are cut off by cutting along the virtual cutting line 53 (virtual cutting line 53A) using a cutting tool generally used. The cutting tool used is a dicing saw, for example.

As described above, in the method of manufacturing the semiconductor wafer 50, as viewed from the direction perpendicular to the main surface 50a, the shortest distance from the virtual cutting line 53B to the edge of the semiconductor region 5 is set to be smaller than the shortest distance from the virtual cutting line 53A to the edge of the semiconductor region 5. In this manufacturing method, the side surface 50c to which the semiconductor region 3 is exposed is formed in the semiconductor wafer 50A by providing the through-slit along the virtual cutting line 53B, and the semiconductor region 11 of the first conductivity type is provided on the side surface 50c. Therefore, the semiconductor wafer 50 manufactured by this manufacturing method has the chip portion 51 in which the dead area is reduced and an increase in leakage current from the side surface 50c can be suppressed by the semiconductor region 11.

As described in Patent Literature 1, in the method of forming the semiconductor region 11 by adding impurities from a hole that does not penetrate through the semiconductor wafer 50, the impurities are blocked by the hole bottom, and accordingly there is a possibility that the impurities will not be added to the entire side surface 50c. In this case, the leakage current may increase from a portion where impurities are not sufficiently added in the side surface 50c. In this manufacturing method, since the semiconductor region 11 is provided by adding impurities to the side surface 50c that is exposed by providing the through-slit β, the semiconductor region 11 can be appropriately formed on the entire side surface 50c compared with a case where impurities are added from holes.

In the manufacturing method according to the embodiment described above, the passivation film 21, patterning, the bump electrode 23, and the like are formed after providing the semiconductor region 11 of first conductivity type on the side surface 50c that is exposed by providing the through-slit β. When the passivation film 21, the patterning, the bump electrode 23, and the like are formed, the semiconductor region 11 is already provided in the semiconductor wafer 50A. Therefore, the passivation film 21, the patterning, the bump electrode 23, and the like can be easily formed.

The through-slit β is provided by dry etching. In this manner, the inclination of the side surface 50c can be reduced compared with a case where the through-slit β is provided by wet etching. Therefore, the dead area can be reduced compared with a case where the side surface is made to be inclined by using wet etching. In addition, for example, as illustrated in FIG. 2, in a case where a plurality of semiconductor energy ray detecting elements ED1 are arranged such that the side surfaces 1c are adjacent to each other, the time and effort of forming the side surface 1c (side surface 50c of the chip portion 51) in the semiconductor energy ray detecting element ED1 can be reduced.

A step of providing a metal layer on the main surface 50a and the main surface 50b is further included, and impurities are added to the side surface 50c of the semiconductor wafer 50A by ion implantation after the metal layer is provided. In this manner, since the impurities are added by ion implantation, heat applied to the semiconductor wafer 50A can be reduced compared with a case where the impurities are added by diffusion. Therefore, it is possible to manufacture the semiconductor wafer 50 in which the metal layer can be appropriately formed and the impurities are sufficiently added.

The semiconductor region 7 is provided such that the length T1 of the semiconductor region 7 in the thickness direction of the semiconductor region 7 is smaller than the length T2 of the semiconductor region 5 in the thickness direction of the semiconductor region 5. For example, energy rays having low light transmittance, such as soft X-rays, are unlikely to be absorbed in the semiconductor region 7. For this reason, detection accuracy is improved for energy rays having low light transmittance, such as soft X-rays.

As described above, in the method of forming the semiconductor region 11 by adding impurities from a hole that does not penetrate through the semiconductor wafer 50 as described in Patent Literature 1, the impurities are blocked by the hole bottom, and accordingly there is a possibility that the impurities will not be added to the entire side surface 50c. In particular, in a case where the length of the semiconductor region 7 in the thickness direction of the semiconductor region 7 is reduced in order to detect energy rays having low light transmittance, the semiconductor region 7 and the semiconductor region 11 are unlikely to be connected to each other, and accordingly there is a possibility that a region where no impurities are added will be present. In this case, the depletion layer may reach the side surface 1c through the region. In this manufacturing method, since the semiconductor region 11 is formed by adding impurities to the side surface 50c that is exposed by providing the through-slit β, the semiconductor region 7 and the semiconductor region 11 are easily and appropriately connected to each other, and accordingly an increase in leakage current can be suppressed.

The semiconductor energy ray detecting element ED1 is manufactured by preparing the semiconductor wafer 50 manufactured by the above-described manufacturing method and cutting off the chip portion 51 along the virtual cutting line 53A. In the semiconductor energy ray detecting element ED1 manufactured by the manufacturing method, the dead area is reduced, and an increase in leakage current from the side surface 50c can be suppressed by the semiconductor region 11. Since impurities are added to the side surface 50c that is exposed by providing the through-slit β, the impurities are added more appropriately than in a case where the impurities are added from holes.

In the method of manufacturing the semiconductor energy ray detecting element ED1, the shortest distance from the virtual cutting line 53B to the edge of the semiconductor region 5 is set to be smaller than the shortest distance from the virtual cutting line 53A to the edge of the semiconductor region 5. The shortest distance from the virtual cutting line 53A to the edge of the semiconductor region 5 is set to be larger than the shortest distance from the virtual cutting line 53B to the edge of the semiconductor region 5. The depletion layer spreads from the semiconductor region 5. Therefore, in the semiconductor energy ray detecting element ED1, the depletion layer is unlikely to reach a cut surface along the virtual cutting line 53A.

In the semiconductor wafer 50, the chip portion 51 has the semiconductor region 11 located on the side surface 50c. The shortest distance from the side surface 50c to the edge of the semiconductor region 5 is smaller than the shortest distance from the virtual cutting line 53 (virtual cutting line 53A) to the edge of the semiconductor region 5. Therefore, cutting the chip portion 51 with the virtual cutting line 53 (virtual cutting line 53A) makes it possible to manufacture the semiconductor energy ray detecting element ED1 in which the dead area is reduced and in which an increase in leakage current from the side surface 50c in the semiconductor region 11 can be suppressed.

While the preferred embodiment of the present invention has been described above, the present invention is not necessarily limited to the above-described embodiment, and various changes can be made without departing from the scope of the present invention.

In the embodiment described above, one chip portion 51 is disposed on one semiconductor wafer 50. However, the number of chip portions 51 disposed on the semiconductor wafer 50 is not limited to one. A plurality of chip portions 51 may be disposed on one semiconductor wafer 50.

The semiconductor substrate 1 and the chip portion 51 are rectangular in plan view in the embodiment described above, but are not limited to this. For example, the semiconductor substrate 1 and the chip portion 51 may be hexagonal in plan view. In this case, the through-slit β may be provided along five sides of the six sides of the edge of the chip portion 51, and the virtual cutting line 53 may be set along the remaining one side.

The order in which the semiconductor region 5, the semiconductor region 7, the semiconductor region 9, and the semiconductor region 11 are provided is not limited to the order described in the present embodiment. The semiconductor region 9 may not be provided. In this case, on the main surface 50a side of the semiconductor wafer 50, the semiconductor region 11 provided on the side surface 50c side is adjacent to the semiconductor region 3.

The order in which the insulating film 13, the electrodes 15 and 17, the passivation film 21, the bump electrode 23, and the through-slit β are provided is not limited to that described in the present embodiment. For example, the through-slit β may be provided after the bump electrode 23 is provided. The insulating film 13, the electrodes 15 and 17, the passivation film 21, and the bump electrode 23 may be provided not in the step of manufacturing the semiconductor wafer 50 but in the step of manufacturing the semiconductor energy ray detecting element ED1 using the semiconductor wafer 50.

The semiconductor substrate 1 and the semiconductor wafer 50 may be configured by reversing the positions of the semiconductor region of the first conductive type and the semiconductor region of the second conductive type.

REFERENCE SIGNS LIST 3, 5, 7, 11 semiconductor region
19 metal layer
50, 50A semiconductor wafer
50a, 50b main surface
50c side surface
51 chip portion
53, 53A, 53B virtual cutting line
α energy ray sensitive region
β through-slit
ED1 semiconductor energy ray detecting element.

The invention claimed is:

1. A semiconductor wafer manufacturing method, comprising:
preparing a semiconductor wafer having a first semiconductor region of a first conductivity type, the first semiconductor region including a first main surface and a second main surface facing each other;
providing a second semiconductor region of a second conductivity type on the first main surface side of the first semiconductor region, the second semiconductor region forming an energy ray sensitive region together with the first semiconductor region;
providing a third semiconductor region of the first conductivity type on the second main surface side of the first semiconductor region, the third semiconductor region having a higher impurity concentration than the first semiconductor region;
forming a side surface in a chip portion by providing a through-slit penetrating entirely through the semiconductor wafer such that the through-slit does not have a bottom in a thickness direction along a second virtual cutting line of a first virtual cutting line and the second virtual cutting line, the side surface to which the first semiconductor region is exposed, the chip portion including the energy ray sensitive region, the first virtual cutting line and the second virtual cutting line defining the chip portion as viewed from a direction perpendicular to the first main surface, a shortest distance from the second virtual cutting line to an edge of the second semiconductor region being smaller than a shortest distance from the first virtual cutting line to the edge of the second semiconductor region; and
providing a fourth semiconductor region of the first conductivity type on the side surface side by adding impurities to the side surface,
wherein the through-slit, which penetrates entirely through the semiconductor wafer, is formed before the step of providing the fourth semiconductor region.

2. The semiconductor wafer manufacturing method according to claim 1,
wherein the through-slit is provided by dry etching.

3. The semiconductor wafer manufacturing method according to claim 1, further comprising:
providing a metal layer on the first main surface and the second main surface,
wherein the impurities are added to the side surface of the chip portion by ion implantation after the metal layer is provided.

4. The semiconductor wafer manufacturing method according to claim 1,
wherein the third semiconductor region is provided such that a length of the third semiconductor region in a thickness direction of the third semiconductor region is smaller than a length of the second semiconductor region in a thickness direction of the second semiconductor region.

5. A method of manufacturing a semiconductor energy ray detecting element, comprising:
preparing a semiconductor wafer manufactured by the manufacturing method according to claim 1; and
cutting off the chip portion along the first virtual cutting line.

6. A semiconductor wafer having a first main surface and a second main surface facing each other, comprising:
a chip portion including an energy ray sensitive region and defined by a through-slit penetrating entirely through the semiconductor wafer such that the through-slit does not have a bottom in a thickness direction and a virtual cutting line as viewed from a direction perpendicular to the first main surface,
wherein the chip portion includes:
a first semiconductor region of a first conductivity type, being located on the first main surface side;
a second semiconductor region of a second conductivity type, being located on the first main surface side and forming the energy ray sensitive region together with the first semiconductor region;

a third semiconductor region of the first conductivity type, being located on the second main surface side, and having a higher impurity concentration than the first semiconductor region; and a fourth semiconductor region of the first conductivity type, being located on a side surface side connected to the first main surface and the second main surface, and having a higher impurity concentration than the first semiconductor region, wherein the chip portion has a polygonal shape as viewed from the direction perpendicular to the first main surface, the through-slit is provided along a plurality of sides of the polygonal shape, and a shortest distance from the side surface of the chip portion to an edge of the second semiconductor region is smaller than a shortest distance from the virtual cutting line to the edge of the second semiconductor region.

\* \* \* \* \*